United States Patent [19]

Moriyama

[11] 4,450,433
[45] May 22, 1984

[54] D/A CONVERTING CIRCUIT HAVING TWO D/A CONVERTERS FOR DECODING AND CONVERTING A DIGITAL SIGNAL INTO AN ANALOG SIGNAL

[75] Inventor: Masaru Moriyama, Yamato, Japan

[73] Assignee: Victor Company of Japan, Limited, Yokohama, Japan

[21] Appl. No.: 343,158

[22] Filed: Jan. 27, 1982

[30] Foreign Application Priority Data

Jan. 28, 1981 [JP] Japan .................................. 56-11167

[51] Int. Cl.³ ............................................. H03K 13/02
[52] U.S. Cl. ......................... 340/347 DA; 340/347 M
[58] Field of Search ..... 340/347 M, 347 DA, 347 CC

[56] References Cited

PUBLICATIONS

Advanced Micro Devices, The Designers' Guide '80 by Advanced Micro Devices, Inc. pp., 10-24 and 10-25.

Primary Examiner—T. J. Sloyan
Attorney, Agent, or Firm—Lowe, King, Price & Becker

[57] ABSTRACT

A D/A converting circuit comprises two data selectors and two D/A converters having an external reference input terminal. A decoder responsive to several bits including the MSB of the input digital signal to be converted into an analog signal is provided to detect whether the input digital signal represents an analog signal magnitude which is greater than the full-scale value of the analog signal or not, and thus expansion-nonexpansion operation of the D/A converting circuit is controlled so that an m-bit D/A converter can be used, as the first D/A converter, to handle an n-bit digital signal where n>m. The first D/A converter receives m-bit information including the MSB in expansion mode, and receives m-bit information including the LSB in nonexpansion mode. The second D/A converter receives K-bit information (K=n−m) including the LSB of the input digital signal in expansion mode, and receives a predetermined digital data from a fixed data circut in nonexpansion mode. The second D/A converter performs D/A conversion by using a fixed voltage, and the output analog voltage of the second D/A converter is added to the fixed voltage prior to being fed to the first D/A converter as its reference voltage when expansion is required.

6 Claims, 8 Drawing Figures

FIG. 1 PRIOR ART
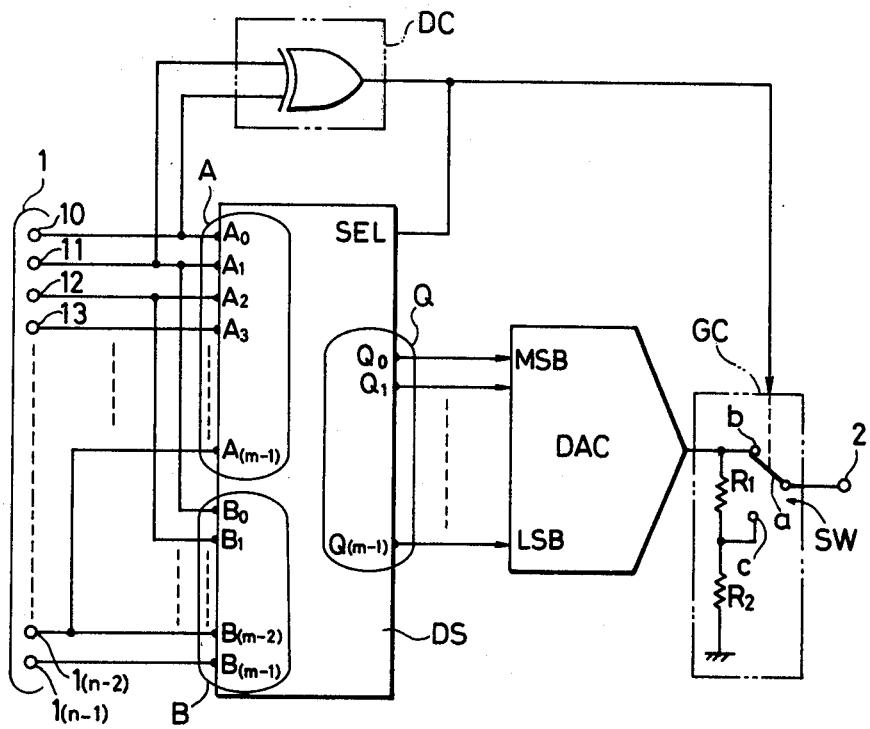
FIG. 2
|  | MSB | BIT$_2$ | BIT$_3$ | BIT$_4$ |
|---|---|---|---|---|
| POSITIVE FULL-SCALE VALUE → | 0 | 1 | 1 | 1 |
|  | 0 | 0 | 1 | 1 |
|  | 0 | 0 | 0 | 1 |
| 0 | 0 | 0 | 0 | 0 |
|  | 1 | 1 | 1 | 1 |
|  | 1 | 1 | 1 | 0 |
|  | 1 | 1 | 0 | 0 |
| NEGATIVE FULL-SCALE VALUE ↘ | 1 | 0 | 0 | 0 |
FIG. 3
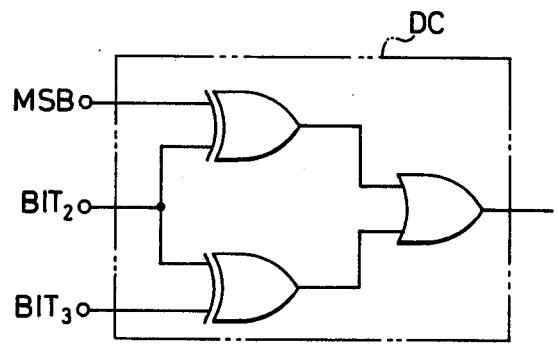

D/A CONVERTING CIRCUIT HAVING TWO D/A CONVERTERS FOR DECODING AND CONVERTING A DIGITAL SIGNAL INTO AN ANALOG SIGNAL

BACKGROUND OF THE INVENTION

This invention relates generally to D/A converting circuits which are used for decoding and converting a digital signal, such as a PCM signal into an analog signal, such as an audio signal, and more particularly, the present invention relates to D/A converting circuit in which expansion is effected so that an input digital signal of given bits can be processed by D/A converters of less bits.

As is well known, the dynamic range of an analog signal processed by an A/D conveter or a D/A converter is determined by the number of entire bits of the A/D converter or the D/A converter.

Since the cost of A/D converters or D/A converters remarkably increases as the bit number increases, in digital devices of low cost for instance, so called compression type A/D converting circuits and expansion type D/A converting circuits are often used so that signal processing can be performed by using low cost A/D converters or D/A converters having less bit numbers where the dynamic range of the signal to be processed is wider than the dynamic range corresponding to the bit number of the converter used.

Although conventional expansion type D/A converting circuits, which will be described hereinafter is capable of ensuring a desired dynamic range by using a D/A converter of a small number of bits by performing expansion of given bits in the case that the input digital signal represents an analog signal magnitude which is greater than one-half of the full-scale value of the analog signal, there is a problem that quantization error occurs greatly on expansion because the subrange or step size on expansion becomes wider than the subrange on nonexpansion. Also the accuracy of resistors used in a variable gain circuit, which is used for expansion, is required to correspond to K bits, while circuit accuracy deteriorates due to D.C. leak in an electronic switch of the variable gain circuit, and therefore, a solution for these has been desired.

SUMMARY OF THE INVENTION

This invention has been developed in order to remove the above-described various disadvantages and drawbacks inherent to the conventional expansion type D/A converting circuits.

It is, therefore, an object of the present invention to provide a D/A converting circuit which is capable of producing an analog signal having a satisfactory waveform by making each subrange on D/A conversion substantially small.

In accordance with the present invention there is provided a D/A converting circuit comprising: a decoder responsive to at least two bits of an input digital signal to be converted into an analog signal, one of said two bits being an MSB of said input digital signal, said decoder producing an output signal indicating that the magnitude of an analog signal represented by the input digital signal is greater than a predetermined value or not; a first data selector controlled by the output signal from said decoder for selecting, as its output data, one of two sets of consecutive bits of said input digital signal, one of said two sets including said MSB and the other including an LSB of said input digital signal; a first D/A converter having an external reference voltage input terminal, and being responsive to the output data from said first data selector for producing an output analog signal by using a first reference voltage applied to said external reference voltage input terminal; a digital data generator for producing a predetermined digital data; a second data selector controlled by said output signal from said decoder for selecting, as its output data, one of a set of consecutive bits of said input digital signal including said LSB, and said predetermined digital data from said digital data generator; a second D/A converter having an external reference voltage input terminal, and being responsive to the output data from said second data selector for producing an output analog signal by using a second reference voltage applied to said external reference voltage input terminal, said second D/A converter producing a voltage having a specific relationship with respect to said second reference voltage when said predetermined digital data is applied thereto via said second data selector; a D.C. voltage source for producing a predetermined voltage which is fed to said external reference voltage input terminal of said second D/A converter as said second reference voltage; and means for producing said first reference voltage fed to said external reference voltage input terminal of said first D/A converter, said means being controlled by said output signal from said decoder for supplying said external reference voltage input terminal of said first D/A converter with the sum of said second reference voltage and the output voltage of said second D/A converter, or only said second reference voltage.

BRIEF DESCRIPTION OF THE DRAWINGS

The object and features of the present invention will become more readily apparent from the following detailed description of the preferred embodiments taken in conjunction with the accompanying drawings in which:

FIG. 1 is a block diagram showing an example of a conventional D/A converting circuit;

FIG. 2 is an explanatory diagram of the input digital signal to be converted into an analog signal;

FIG. 3 is a block diagram showing an example of the structure of a decoder which may be used in the conventional D/A converting circuit of FIG. 1 or in an embodiment according to the present invention;

The same or corresponding elements and parts are designated at like references throughout the drawings.

DETAILED DESCRIPTION OF THE INVENTION

Figure 4:
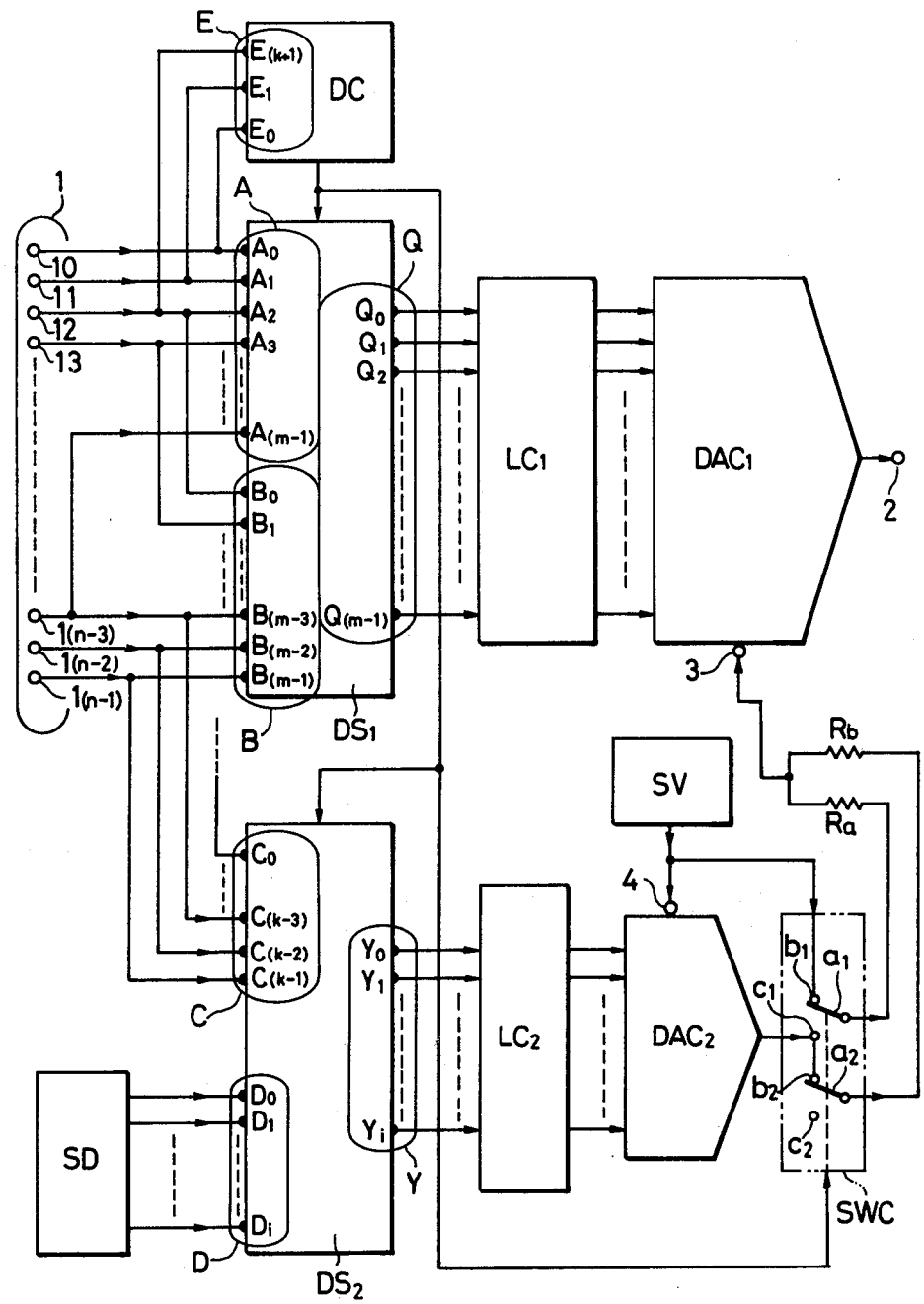
FIG. 4 is a block diagram of an embodiment of the D/A converting circuit according to the present invention.

Prior to describing the preferred embodiment of the present invention, the above-mentioned conventional D/A converting circuit will be described for better understanding of the invention.

FIG. 1 is a block diagram of an example of a conventional expansion type D/A converting circuit, and the problem residing in the conventional expansion type D/A converting circuits will be described with reference to the conventional expansion type D/A converter shown in FIG. 1.

In FIG. 1, the reference numeral 1 indicates generally a set of input terminals for receiving an input digital signal, and the input terminal set 1 comprises "n" terminals 10, 11 ... 1(n−1) in the case that the input digital signal is of "n" bits.

The reference DC is a decoder for generating a signal indicating whether the magnitude of an analog signal represented by the input digital signal is greater than a predetermined value or not by decoding some bits (two bits in the illustrated example) including the MSB (most significant bit) of the input digital signal. The reference DS is a data selector having an input terminals set A to which information of m-bits including the MSB of the input n-bit digital signal is applied (wherein n>m), and another input terminal set B to which m-bit information including the LSB (least significatnt bit) of the n-bit input digital signal is applied. The data selector DS has an output terminal set Q for outputting m-bit information, and is arranged to selectively send one of the signals fed through the above-mentioned two input terminal sets A and B to the output terminal set Q in response to a selection signal applied to a terminal SEL thereof.

The reference DAC is a D/A converter which produces an analog signal in accordance with m-bit digital signal applied from the output terminal set Q of the data selector DS, and the reference GC is a gain controllable circuit arranged to send its output to an output terminal 2.

In the case that the input digital signal is of "n" bits, while the D/A converter DAC used is of "m" bits, it is necessary that the D/A converting circuit performs expansion operation of (n−m)=K bits.

Taking an example of a case that the input digital signal is of 4-bit and the D/A converter DAC is of 3-bit for simplicity, since (n−m)=K is written as (4−3)=1, expansion operation corresponding to 1-bit, i.e. 6 dB, has to be performed in the D/A converting circuit.

Assuming that the input digital signal is constructed of a binary code in accordance with 2s complement method, it is only required to check if the higher two bits of the input digital signal assume 1, 0 or 0, 1 to ascertain whether expansion operation in the D/A converting circuit is necessary or not as will be apparent from FIG. 2, and in this case, a simple exclusive OR gate may be used as the decoder DC as shown in FIG. 1.

Furthermore, it is only necessary to check the higher three bits of the input digital signal to ascertain whether expansion operation is necessary in the D/A converting circuit when intended to make the D/A converting circuit perform expansion operation of 12 dB. In this case, the structure of the decoder DC will be such that as shown in FIG. 3.

Generally speaking, it will be known whether expansion is required or not in the D/A converting circuit in the case where the D/A converting circuit is to perform K-bit expansion operation by using the higher (K+1) bits of the input digital signal.

In the conventional D/A converting circuit of FIG. 1, which shows a structure for performing 1-bit expansion, the highest place information (MSB) of the input digital signal is applied to the terminal 10 of the input terminal set 1, while information of a place next to the MSB of the input digital signal is applied to the terminal 11 of the input terminal set 1, and remaining bits of the input digital signal are respectively applied to the following terminals 12, 13 ... so that the lowest place information (LSB) of the input digital signal is applied to the terminal 1(n−1) of the input terminal set 1.

The first terminal 10 of the input terminal 1 is connected to a first terminal A0 of the terminal set A of the data selector DS and to the decoder DC, while the second terminal 11 of the input terminal 1 is connected to a second terminal A1 of the terminal set A of the data selector DS, to a first terminal B0 of the other terminal set B, and to the decoder DC, and furthermore, the third terminal 12 of the input terminal 1 is connected to a third terminal A2 of the terminal set A of the data selector DC and to a second terminal B1 of the other terminal set B. In this way, respective terminals of the input terminal 1 are respectively connected to the terminals of the terminal sets A and B of the data selector DS, and the last terminal 1(n−1) of the input terminal 1 is connected to only a terminal B(m−1) of the terminal set B of the data selector DS.

Accordingly, to the terminals A0 to A(m−1) of the terminal set A of the data selector DS is applied information of "m" bits including the MSB of the input digital signal, while the terminals B0 to B(m−1) of the terminal set B of the data selector DS receive information of "m" bits ranging from a place next to the MSB through the LSB of the input digital signal.

One of the m-bit digital signals at the input terminal sets A and B of the data selector DS is selected by the selection signal applied from the decoder DC, and the selected information is outputted to corresponding terminals Q0 to Q(m−1) of the output terminal set Q so as to be fed to the D/A conerter DAC as its input digital signal.

Namely, when the input digital signal applied to the input terminal 1 represents an analog signal magnitude which is greater than one-half of the full-scale value of the analog signal, the information fed to the input terminal set A appear at the output terminal set Q of the data selector DS by the selection signal outputted from the decoder DC. On the other hand, when the input digital signal applied to the input terminal 1 represents an analog signal magnitude which is smaller than one-half of the full-scale value, the information fed to the other input terminal set B appear at the output terminal set Q of the data selector DS by the selection signal outputted from the decoder DC.

In addition, since a movable contact "a" of a changeover switch SW of the variable gain circuit GC is switched by the selection signal outputted from the above-mentioned decoder GC, when the input digital signal applied to the input terminal 1 represents an analog signal magnitude which is greater than one-half of the full-scale value, the output signal from the DA converter DAC is sent via a stationary contact "b" of the changeover switch SW and the movable contact "a" of the same to the output terminal 2; and on the other hand, when the input digital signal applied to the input terminal 1 represents an analog signal magnitude which is greater than one-half of the full-scale value, the output signal voltage from the D/A converter DAC is reduced by half by resistors R1 and R2, and the reduced voltage is then sent via a stationary contact "c" of the changeover switch SW and the movable contact "a" of the same to the output terminal 2.

Although the conventional expansion type D/A converting circuit shown in FIG. 1 is capable of ensuring a desired dynamic range by using a D/A converter of a small number of bits by performing the above-mentioned operations so that expansion operation corresponding to K bits is performed in the case that the input digital signal represents an analog signal magnitude which is greater than one-half of the full-scale value, there is a problem that quantization error occurs greatly on expansion because the step size or subrange on expansion becomes wider than the step size or subrange on nonexpansion, and also the accuracy of resistors used in the variable gain circuit is required to correspond to K bits, while circuit accuracy deteriorates due to D.C. leak in an electronic switch of the variable gain circuit, and therefore, improvement is desired.

The present invention proposes to provide an expansion type D/A converting circuit which is capable of resolving the various problems in the conventonal expansion type D/A converting circuit desribed with reference to FIG. 1.

FIG. 4 is a block diagram of an embodiment of the D/A converting circuit according to the present invention, and in FIG. 4, the reference numeral 1 is an input terminal set for receiving an input digital signal; DC, a decoder; DS1 and DS2, first and second data selectors; LC1 and LC2, first and second latch circuits; DAC1, a first D/A converter of the type having an external reference input terminal 3; DAC2, a second D/A converter of the type having an external reference input terminal 4; SV, a reference voltage source; SD, a fixed data circuit; SWC, a switching circuit; Ra and Rb, resistors; and 2, an output terminal.

The input terminal set 1 comprises "n" terminals 10, 11 ... 1(n−1) corresponding to "n" bits of the input digital signal. As the first data selector DS1, is used a circuit which is capable of outputting by switching two input signals of "m" bits expressed in terms of (n−K)=m in the case that the D/A converting circuit is constructed so as to peform expansion operation of K bits.

In the date selector DS1 of FIG. 4, the reference A is a set of "m" input terminals A0, A1 ... A(m−1), while the reference B is another set of "m" input terminals B0, B1 ... B(m−1). The reference Q is a set of "m" output terminals B0, B1 ... B(m−1), and the data selector DS1 is arranged to cause the digital signal applied to the input terminal set A to appear at the output terminal sets Q or to cause the digital signal applied to the input terminal set B to appear at the output terminal sets Q in accordance with the selection signal applied from the decoder DC.

The respective terminals 10 ... 1(n−1) of the input terminal set 1 are respectively connected to the terminals from A0 to A(m−1) and from B0 to B(m−1) of the input terminals sets A and B of the data selector DS1, in the example of a D/A converting circuit of FIG. 4 which is capable of 2-bit expansion. The way of connection is such that the terminal 10 is connected to the terminal A0, terminal 11 to terminal A1, terminal 12 to terminals A2 and B0, ... terminal 1(n−3) to terminals A(m−1) and B(m−3), terminal 1(n−2) to terminal B(m−2).

Generally speaking, in the case or arranging a D/A converting circuit so as to perform K-bit expansion, the method of connection between the respective terminals 10, 11 ... 1(n−1) of the input terminal set 1 and the respective terminals from A0 to A (m−1) and from B0 to B(m−1) of the input terminal sets A and B of the data selector DS1 is such that the first terminal 10 is connected to the terminal A0, the Kth terminal 1(K+1) from the first terminal 10 is connected to the terminal B0, the terminal 1(n−K) to the terminal A (m−1), the terminal 1(n−1) to the terminal B(m−1) (description of the way of connection between respective terminals A1 to A(m−2), which are between the terminal A0 and the terminal A(m−1), and respective terminals B1 to B(m−2), which are between the terminal B0 and the terminal B(m−1), is omitted.

The way of connection between respective terminals E0, E1 ... of the input terminal set E of the decoder DC and respective terminals 10, 11 ... of the input terminal set 1 is such that the terminal 10 is connected to the terminal E0, the terminal 11 is connected to the terminal E1, and generally speaking, in the case that the input digital signal is or binary code, in a D/A converting circuit capable of K-bit expansion, information to be applied to the decoder DC has places whose number equals (K+1), including the MSB of the input digital signal.

The above-mentioned decoder DC produces a signal indicating whether the analog signal magnitude represented by the input digital signal exceeds a predetermined value or not in accordance with the information of given bits including the MSB of the input digital signal, and this signal is fed to the data selectors DS1 and DS2 as the selection signal, and to a switching circuit SWC, which will be described later, as a switching control signal. Thus, an m-bit digital signal selected and appeared at the output terminal set Q of the data selector DS1 is fed via a latch circuit LC1 to the first D/A converter DAC1.

The second data selector DS2 comprises two input terminal sets C and D, and an output terminal set Y, and is arranged such that the digital signal applied to the input terminal set C appear at the output terminal set Y when the D/A converting circuit performs expansion, and the digital signal applied to the input terminal set D appear at the output terminal set Y when the D/A converting circuit does not perform expansion, in accordance with the selection signal supplied from the decoder DC.

The input terminal set C of the second data selector DS2 comprises K terminals C0, C1 ... C(k−1) in the case that the D/A converting circuit is arranged so as to be capable of performing K-bit expansion, and respective terminals C0 to C(k−1) of the input terminal set C of the second data selector DS2 are respectively connected to consecutive K terminals including the terminal 1(n−1) of the input terminal set 1.

Since the information applied to the input terminal set C of the second data selector DS2 is of consecutive K-bit including the LSB of the input digital signal, the consecutive K-bit information including the LSB of the input digital signal applied to the input terminal set C of the data selector DS2 appear at the output terminal set Y when the D/A converting circuit performs expansion, and the output information is fed via the second latch circuit LC2 to the second D/A converter DAC2 as its input signal.

To the other input terminal set D of the second data selector DS2 is applied a digital signal produced by the fixed data circuit SD, and the digital signal applied to the input terminal set D appear at the output terminal set Y of the second data selector DS2 under the condition that the D/A converting circuit performs nonexpansion operation, and the output signal of the second data selector DS2 is then fed via the latch circuit LC2 to the second D/A converter DAC2 as its input signal.

Data to be applied from the above-mentioned fixed data circuit SD to the input terminal set D of the second data selector DS2 is selected such that the output voltage from the second D/A converter DAC2 equals V/2K when the D/A converting circuit performs non-expansion assuming that the external reference signal (external reference voltage) applied to the external reference input terminal 3 of the first D/A converter DAC1 when the D/A converting circuit performs expansion.

To the external reference input terminal 4 of the second D/A converter DAC2 is applied an external reference voltage from a reference voltage source SV, and the external reference voltage from the above-mentioned reference voltage source SV is arranged to indicate a voltage value V which is required to be supplied to the external reference input terminal 3 of the first D/A converter DAC1 when the D/A converting circuit peforms expansion.

The output of the above-mentioned second D/A converter DAC2 and the reference voltage from the reference voltage source SV are respectively applied via the switching circuit SWC, which performs switching operation depending on the switching control signal applied from the decoder DC, to resistors Ra and Rb which constitute an adder. These two voltages are then added by the resistors Ra and Rb prior to being fed to the external reference input terminal 3 of the above-mentioned first D/A converter DAC1. Therefore, the voltage applied to the external reference input terminal 3 of the above-mentioned first D/A converter DAC1 as the external reference voltage changes in accordance with the switching operation of the switching circuit SWC. Namely, when the input digital signal represents an analog signal magnitude which is greater than a predetermined value, such as one-half of the full-scale value of the analog signal, and under this condition, the voltage from the fixed voltage source SV is added to the analog voltage from the second D/A converter DAC2 by the adder and the added voltage is applied to the external reference signal input terminal 3 of the first D/A converter DAC1. On the contrary, when the input digital signal represents an analog signal mangnitude which is smaller than the predetermined value, the voltage V from the fixed voltage source SV is changed to V/2K by the second D/A converter DAC2, and only this voltage V/2K is fed to the external reference signal input terminal 3 of the first D/A converter DAC1.

Namely, in the case that the D/A converting circuit is arranged to be able to perform K-bit expansion, when the input digital signal represents an analog signal magnitude which is greater than one-half of the full-scale value, m-bit information including the MSB of the input digital signal applied to the input terminal set A of the first data selector DS1 appears at the output terminal set Q of the same by the selection signal obtained as the output signal of the decoder DC, and this signal at the output terminal set Q is applied via the first latch circuit LC1 to the first D/A converter DAC1 as an input signal, while the information at the input terminal set C of the second data selector DS2, to which K-bit information including the LSB of the input digital signal is applied, appears at the output terminal set Y of the same by the selection signal from the decoder DC. Furthermore, since the switching circuit SWC, to which the output of the decoder DC is applied as a switching control signal, has been switched such that the movable contact a1 thereof is in contact with the stationary contact b1, and the movable contact a2 is in contact with the stationary contact b2, the reference voltage V of the reference voltage source SV is applied to the external reference input terminal 3 of the first D/A converter DAC1 through a pass formed by the stationary contact b1 of the switching circuit SWC→the movable contact a1→the resistor Ra→the external reference input terminal 3, while the output voltage of the second DA converter DAC2, to which K-bit information including the LSB of the input digital signal is applied through a pass formed by the stationary contact b2 of the switching circuit SWC→the movable contact a2→the resistor Rb.

On the other hand, when the input digital signal represents an analog signal magnitude which is smaller than one-half of the full-scale value, m-bit information including the LSB of the input digital signal applied to the input terminal set B of the first data selector DS1 appears at the output terminal set Q of the same by the selection signal obtained as the output signal of the decoder DC, and this m-bit signal is applied via the first latch circuit LC1 to the first D/A converter LAC1 as an input signal, while the digital signal preset in the fixed data circuit SD is fed via the second latch circuit LC2 to the second D/A converter as an input signal because the second data selector DAC2 is switched by the selection signal from the decoder DC so that the output terminal set Y is in contact with the input terminal set D to which the digital signal is applied from the fixed data circuit SD. Furthermore, since the switching circuit SWC, to which the output signal of the decoder DC is applied as a switching control signal, has been switched such that the movable contact a1 thereof is in contact with the stationary contact c1, and the movable contact a2 is in contact with the stationary contact C2, the output voltage V/2K of the second D/A converter DAC2 is applied to the external reference input terminal 3 of the first D/A converter DAC1 through a pass formed by the stationary contact c1 of the switching circuit SWC→the movable contact a1→the resistor Ra→the external reference input terminal 3.

As is apparent from the above description, in the D/A converting circuit according to the present invention, if the input digital signal represents an analog signal magnitude which is greater than one-half of the full-scale value, not only the reference voltage V from the reference voltage source SV but also an analog signal voltage corresponding to the K-bit information including the LSB of the input digital signal are applied to the external reference voltage input terminal 3 of the D/A converter DAC1 after being added to each other. This analog signal voltage corresponding to the K-bit information including the LSB of the input digital signal is obtained by converting the K-bit information including the LSB on the basis of the reference voltage V applied to the external reference input terminal 4 of the second D/A converter DAC2, and may be referred to as a quantization error voltage. The quantization error voltage will be superposed on the constant voltage V from the fixed voltage source SV so that the added voltage is applied to the external reference input terminal 4 of the first D/A converter DAC1. Therefore, the analog signal voltage corresponding to the K-bit information including the LSB of the input digital signal will be used as a correction voltage in the first D/A converter DAC1. As a result, the subrange or step size, which tends to be wider on expanding operation of the D/A converting circuit, can be maintained small enough.

Figure 5A:
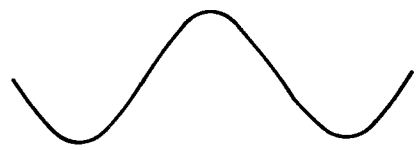
FIGS. 5A to 5D are explanatory waveform charts showing the difference between the output analog signal waveforms respectively obtained by the conventional A/D converting circuit and by the embodiment of the present invention.
Figure 5B:
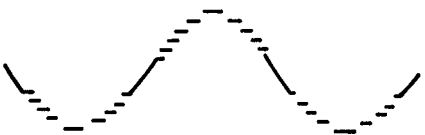
Figure 5C:
Figure 5D:
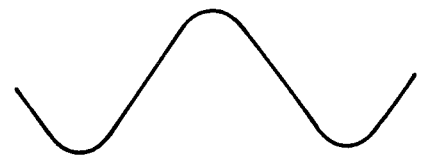

FIGS. 5A to 5D are waveform charts for the description of the above-mentioned operation in the D/A converting circuit according to the present invention. The waveform charts of FIGS. 5A to 5D show a condition that 1-bit expansion is performed by using a 3-bit D/A converter as the first D/A converter DAC1 in the case that the input digital signal is of 4 bits for the purpose of illustration and description. FIG. 5A is a waveform chart showing an ideal waveform of an output analog signal from a D/A converting circuit; FIG. 5B is a waveform chart showing an output waveform (the output waveform of the above-mentioned conventional expansion type D/A converting circuit of FIG. 1) in the case that 1-bit expansion is performed by applying only the fixed reference voltage V to the external reference input terminal 3 of the first D/A converter DAC1. FIG. 5C is a waveform chart of the quantization error voltage (correction voltage), in the expansion region, produced by the second D/A converter DAC2 in accordance with the lower bits information of the input digital signal when the D/A converting circuit performs expansion. FIG. 5D is a waveform chart of the output analog signal obtained at the output terminal 2 of the first D/A converter DAC1 used in the D/A converting circuit according to the present invention.

With reference to the output waveform charts shown in FIGS. 5A to 5D, it is apparent that the output waveform on expansion by the D/A converting circuit according to the present invention is such that the subrange or step size is small or narrow enough even in the expansion region in contrast with the waveform chart of FIG. 5B showing that the output waveform on expansion in the above-mentioned conventional D/A converting circuit is such that the subrange or step size is wide. Namely, the subranges or quantization steps on D/A conversion is dense enough in the present invention to provide a continuous waveform which is very close to the ideal waveform of FIG. 5A.

As is apparent from the above description, if the input digital signal represents an analog signal magnitude which is within one-half of the full-scale value, the digital signal from the fixed data circuit SD appears at the output terminal set Y of the data selector DS2 in accordance with the selection signal from the decoder DC, and the second D/A converter DAC2, to which the fixed data is applied via the second latch circuit LC2, outputs an output voltage of V/2K all the time and to supply the external reference input terminal 3 of the first D/A converter DAC1 with the same irrespective of the information of the lower bits of the input digital signal.

Since the D/A converting circuit according to the present invention has the above-described structure and operates as described above, it is possible to obtain, in the best condition, so called fully decoded linialization having a resolving power of LSB/2 step of the input digital signal.

In addition, so called monotonic increase can be ensured under the condition that the output accuracy with respect to the digital input of at least the first D/A converter DAC1 is below LSB/2, that the same output accuracy can be obtained by the second D/A converter DAC2, and that the accuracy of the switching circuit SWC and the resistors Ra and Rb does not deteriorate the accuracy of the above-mentioned D/A converters DAC1 and DAC2 because the first D/A converter DAC1 is always supplied with a reference voltage originated from the same voltage source, i.e. the fixed voltage source SV.

Furthermore, in response to small-amplitude signals, namely, in nonexpansion region, since the operation is dependent on only the output accuracy of the first D/A converter DAC1, linearity can be ensured, and accordingly, the D/A converting circuit according to the present invention has made it possible to provide a satisfactory dynamic range and fidelity with low cost, as a D/A converting circuit which deals with audio signals in which sparse and dense information is handled when the signal amplitude is small.

In this way, in the present invention, D/A converters (multiplying type D/A converters) having external reference input terminal are used as the first and second D/A converters DAC1 and DAC2, and the step size on expansion is made substantially small enough by the skillful arrangement so that the problems in the above-mentioned conventional circuit example are resolved, and therefore, according to the present invention a D/A converting circuit having excellent performance can be provided at a low cost.

The above-described embodiments are just examples of the present invention, and therefore, it will be apparent for those skilled in the art that many modifications and variations may be made without departing from the spirit of the present invention.

What is claimed is:

1. A D/A converting circuit comprising:
   (a) a decoder responsive to at least two bits of an input digital signal to be converted into an analog signal, one of said two bits being an MSB of said input digital signal, said decoder producing an output signal indicating that the magnitude of an analog signal represented by the input digital signal is greater than a predetermined value or not;
   (b) a first data selector controlled by the output signal from said decoder for selecting, as its output data, one of two sets of consecutive bits of said input digital signal, one of said two sets including said MSB and the other including an LSB of said input digital signal;
   (c) a first D/A converter having an external reference voltage input terminal, and being responsive to the output data from said first data selector for producing an output analog signal by using a first reference voltage applied to said external reference voltage input terminal;
   (d) a digital data generator for producing a predetermined digital data;
   (e) a second data selector controlled by said output signal from said decoder for selecting, as its output data, one of a set of consecutive bits of said input digital signal including said LSB, and said predetermined digital data from said digital data generator;
   (f) a second D/A converter having an external reference voltage input terminal, and being responsive to the output data from said second data selector for producing an output analog signal by using a second reference voltage applied to said external reference voltage input terminal, said second D/A converter producing a voltage having a specific relationship with respect to said second reference voltage when said predetermined digital data is applied thereto via said second data selector;
   (g) a D.C. voltage source for producing a predetermined voltage which is fed to said external reference voltage input terminal of said second D/A converter as said second reference voltage; and (h) means for producing said first reference voltage fed to said external reference voltage input terminal of said first D/A converter, said means being controlled by said output signal from said decoder for supplying said external reference voltage input terminal of said first D/A converter with the sum of said second reference voltage and the output voltage of said second D/A converter, or only said second reference voltage.

2. A D/A converting circuit as claimed in claim 1, wherein the first reference voltage producing means comprises a switching circuit for switching the output voltage from said voltage source and the output voltage from said second D/A converter, and an adder arranged to add the output voltage from said second D/A converter to said second reference voltage.

3. A D/A converting circuit as claimed in claim 1, wherein said decoder comprises at least one EX-OR gate.

4. A D/A converting circuit as claimed in claim 1, further comprising first and second latch circuits respectively interposed between said first data selector and said first D/A converter, and between said second data selector and said second D/A converter.

5. A D/A converting circuit as claimed in claim 1, wherein said digital data generator is arranged to produce said predetermined data so that said second D/A converter produces, when said predetermined data is fed to said second D/A converter, a voltage expressed by V/2K wherein V is said second reference voltage, and K is the difference between the number of entire bits of said input digital signal and the number of entire bits applied to said first D/A converter.

6. A D/A converting circuit as claimed in claim 1, wherein the number of bits of said input digital signal applied to said second D/A converter equals the difference between the number of entire bits of said input digital signal and the number of entire bits applied to said first D/A converter.

* * * * *

UNITED STATES PATENT AND TRADEMARK OFFICE
CERTIFICATE OF CORRECTION

PATENT NO. : 4,450,433
DATED : May 22, 1984
INVENTOR(S) : Masaru MORIYAMA

It is certified that error appears in the above-identified patent and that said Letters Patent is hereby corrected as shown below:

Column 2, lines 32-33, change "second reference voltage" to --output voltage of said second D/A converter--.

IN THE CLAIMS:

Column 11, lines 10-11 (Claim 1), change "second reference voltage" to --output voltage of said second D/A converter--.

Column 12, line 12 (Claim 5), change "number of entire" to --total number of--.

Column 12, line 13 (Claim 5), change "number of entire" to --total number of--.

Column 12, line 18 (Claim 6), change "number of entire" to --total number of--.

Column 12, line 19 (Claim 6), change "number of entire" to --total number of--.

Signed and Sealed this

Twenty-third Day of October 1984

[SEAL]

Attest:

GERALD J. MOSSINGHOFF

Attesting Officer     Commissioner of Patents and Trademarks